United States Patent
Duan et al.

(10) Patent No.: US 9,178,386 B2
(45) Date of Patent: Nov. 3, 2015

(54) STATE-MATRIX-INDEPENDENT DYNAMIC PROCESS ESTIMATION METHOD IN REAL-TIME FOR WEAKLY OBSERVABLE MEASUREMENT NODES WITHOUT PMU

(75) Inventors: Gang Duan, Beijing (CN); Jingtao Wu, Beijing (CN); Xiaoyan Sun, Beijing (CN); Dong Yang, Beijing (CN)

(73) Assignees: Beijing Sifang Automation Co., Ltd., Beijing (CN); Beijing Sifang Engineering Co., Ltd., Beijing (CN)

( * ) Notice: Subject to any disclaimer, the term of this patent is extended or adjusted under 35 U.S.C. 154(b) by 637 days.

(21) Appl. No.: 13/497,512

(22) PCT Filed: Dec. 9, 2009

(86) PCT No.: PCT/CN2009/001407
§ 371 (c)(1),
(2), (4) Date: Mar. 21, 2012

(87) PCT Pub. No.: WO2011/035461
PCT Pub. Date: Mar. 31, 2011

(65) Prior Publication Data
US 2012/0283967 A1 Nov. 8, 2012

(30) Foreign Application Priority Data
Sep. 25, 2009 (CN) .......................... 2009 1 0093006

(51) Int. Cl.
*H02J 13/00* (2006.01)
*G01R 19/25* (2006.01)

(52) U.S. Cl.
CPC .......... *H02J 13/0006* (2013.01); *G01R 19/2513* (2013.01); *Y02E 60/728* (2013.01); *Y02E 60/74* (2013.01); *Y04S 10/265* (2013.01); *Y04S 10/30* (2013.01)

(58) Field of Classification Search
CPC .......................... H02J 13/0006; G01R 19/2513
See application file for complete search history.

(56) References Cited

U.S. PATENT DOCUMENTS

| 2005/0187726 A1* | 8/2005 | Korba et al. ................... 702/60 |
| 2007/0038396 A1* | 2/2007 | Zima et al. ..................... 702/65 |
| 2010/0049455 A1* | 2/2010 | Scholtz et al. ................. 702/60 |
| 2010/0185336 A1* | 7/2010 | Rovnyak et al. ............. 700/287 |

* cited by examiner

*Primary Examiner* — Mischita Henson
(74) *Attorney, Agent, or Firm* — Gilberto M. Villacorta; Helen H. Zhang; Foley & Lardner LLP

(57) ABSTRACT

A state-matrix-independent dynamic process estimation method in real-time for weakly observable measurement nodes without Phasor Measurement Unit(PMU) is only dependent on real-time measurement dynamic data of measurement nodes with PMU and measurement data of Supervisory Control And Data Acquisition (SCADA) system in electric power system or state estimation data. According to the SCADA measurement data or state estimation data at some continuous moments, the method utilizes recursive least squares solution to find a linear combination relationship between variation of measurement parameter to be estimated of nodes without PMU and variation of corresponding measurement parameter of nodes with PMU. Using the linear combination of relationship, the dynamic process of measurement nodes without PMU is estimated in real-time. The method provides high estimation precision and meets error requirements of engineering application.

10 Claims, 4 Drawing Sheets

STATE-MATRIX-INDEPENDENT DYNAMIC PROCESS ESTIMATION METHOD IN REAL-TIME FOR WEAKLY OBSERVABLE MEASUREMENT NODES WITHOUT PMU

FIELD OF THE INVENTION

The present invention generally relates to wide area measurement technique in electric power system, and more particularly, to a method for estimating dynamic process of measurement of nodes without phasor measurement unit (PMU).

BACKGROUND OF THE INVENTION

Traditionally, in the control center of power system, the operation data of power system is acquired from SCADA (Supervisory Control And Data Acquisition) system, in which the sampling interval for remote measurements of, such as, voltage, current, power, and frequency is about 1-5 seconds and the data is without time-stamp. Thereby only the quasi-steady state of power system can be reflected. In recent years, the synchronized phasor measurement technology based on GPS has been widely used in the electric power system. PMUs based on this technique have been installed at many substations and power plants. PMUs measure voltage phasor, current phasor, power, frequency, and rotating speed of generator of each substation and power plant and transfer them with time-stamps to the control center at a sampling interval of 10ms - 30ms, thereby the control center can monitor the dynamic behaviors of the electric power system. However, at present and in the foreseeable future, only a limited number of substations or power plants are equipped with PMUs, because the corresponding cost is expensive and the PMU data transfer will require a great amount of communication bandwidth. Therefore, the existing wide area measurement system (WAMS) based on PMU cannot observe the dynamic performance of the whole power plants or substations.

In order to monitor the dynamic performance of those power plants, substations, or nodes without PMU, and to assist the operator to make on-line safe and stable decision, it is meaningful to estimate the dynamic process of the nodes without PMU in real time by use of existing on-line measurement data. In the prior arts, only a method is proposed to solve this problem. This method derives the magnitudes and the phase angles of the voltage phasors of those nodes without PMU from those of the nodes with PMU, which is based on the sensitivity relationship between the voltage phasors with PMU and those without PMU and on the corresponding SCADA measurement data. The sensitivity relationship is derived from the Jacobian matrix of power flow equations. However, the method has the following disadvantages:

(1) The elements of the original Jacobian matrix are relating to the magnitude and the phase angle of the voltage and the admittance of the nodes. When the power flow operation points or the network configurations are changed, the Jacobian matrix should be recalculated accordingly. However, the computing burden is very heavy for the recalculation of Jacobian matrix, so that it is not suitable to generate dynamic process data of 10 ms order on line. The prior arts obtain approximate coefficients of linear correlation between the nodes without PMU and those with PMU, which is achieved by ignoring the change of the voltage magnitude and phase angle, by ignoring the resistance of the elements of the grid, and by substituting the imaginary elements of the admittance matrix for the elements of the Jacobian matrix. These coefficients are only renewed when the network configuration is changed. Though this significantly reduces the workload of on-line computation, it sacrifices precision of on-line dynamic process estimation.

(2) The above simplified Jacobian matrix is obtained from the admittance matrix, and it is dependent on the admittance parameters of grid devices, such as transmission lines, transformers, and generators. Usually, these parameters are rated values provided by manufacturers or typical values. However, there often exists a big error between these values and the actual parameters of the grid devices. With the aging of devices and the changing of operation environment, the parameters may be great different from the designed one or the one measured in typical environments. The inaccuracy of parameters will affect the accuracy of the calculated coefficients of linear correlation, thus make the estimation of the measurement dynamic process of the nodes without PMU be inaccurate. The inaccuracy of the above parameters is difficult to be verified and corrected on line one by one, and hence the inaccuracy of the estimation of the dynamic process is also difficult to be corrected.

(3) Moreover, the dynamic process estimation in the prior arts is limited to voltage phasor estimation, and no any for other measurements, especially for power.

Furthermore, it should be noted that there are many prior arts about state estimation or dynamic state estimation by using data from PMU and SCADA. However, they are to improve precision of state estimation of the current or future SCADA measurement time point by use of PMU data, none of them is to estimate the dynamic process of the nodes without PMU.

It can be concluded from the above that up to date there is no precise and practical method for estimating the dynamic process of a measurement node. In this invention, a practical dynamic process estimation method for a measurement node without PMU is proposed, which is only based on real PMU measurements and real SCADA measurement of those nodes with PMU. The method is independent of grid parameters and state matrix renewal, and doesn't need the nodes without PMU to be completely observable. The theory basis of the proposed method is linearization, which, based on the SCADA (or state estimation) data of current and historical time points, finds out the linear combination relation between the variance of measurement node without PMU and the variances of measurement nodes with PMU by using least square method. And then at PMU measurement time point, the corresponding measurement of the node without PMU is estimated from real measurements of the nodes with PMU. The whole estimation process is based on actually measured data, not depending on the parameters of grid devices and the renewal of Jacobian or state matrix, also does not need the measurement node without PMU to be completely observable. The stronger the linear combination relationship is, the smaller the error for dynamic process estimation is. For example, for the dynamic process estimation of voltage phasors, the errors of magnitude are ±0.05%, and the errors of phase angles are ±0.05°. If the linear combination relationship is weaker, the error for dynamic process estimation will become larger. For example, in the dynamic process estimation of active power during low frequency oscillation, the error usually is ±5%, but it is still in the range that can be accepted in engineering.

SUMMARY OF THE INVENTION

In order to overcome the defects that the accuracy of the existing method for estimating the dynamic process of the measurement nodes without PMU is dependent on grid parameters and real time renewal of Jacobian matrix and it is only limited to estimate voltage phasor, the present invention proposes a method for estimating the dynamic process of nodes without PMU in real time based on only the dynamic measurements of nodes with PMU and SCADA measurements or state estimation data. The present method is independent of the grid parameters and renewal of state matrix (or Jacobian matrix). Furthermore, it only needs the estimated node to be weakly observable. The technical scheme of the invention is as follows.

The present method is based on recursive least square method. It finds out the linear combination relationship between the variance of measurement node without PMU and the variances of measurement nodes with PMU from quasi-stable state data sequence during a period of time, that is, SCADA data or state estimation data at a number of consecutive time points. The dynamic process of the node without PMU can be estimated in real time based on the linear combination relationship. The present method comprises steps:

Step 1: Selecting nodes i without PMU and their physical quantities $X_i$ of which dynamic process needing to be estimated. The physical quantity may be voltage magnitude, voltage phase angle, current magnitude, current phase angle, active power, reactive power, frequency, and/or rotating speed of generator.

Step 2: for each node i without PMU, selecting a set of nodes with PMUs $S_{pmu-i}$ for estimating the dynamic process thereof. The set of nodes are usually comprised of a number of nodes with PMU from which the electric distances to the node i without PMU are nearer than others, preferably 4~6 such nodes are enough to form $S_{pmu-i}$. There is no strict requirement for electric distances. While ensuring there are nodes with PMU being in a same electric island with the node i to be estimated, the nodes in the set $S_{pmu-i}$ may be selected according to node impedance matrix calculated offline in typical operation mode, or designated by operator, or determined by online automatic search method according to minimum number of line segments that separates the node with PMU from the node without PMU, in which, the minimum number of line segments between each node with PMU and the node i being calculated automatically according to topological information; then, first adding the nodes with PMU that are connected to the node i by a segment of line into the set $S_{pmu-i}$, after that, adding in turn the nodes with PMU that are connected by two, three, and four segments of line respectively into the $S_{pmu-i}$, until the number of nodes in the set $S_{pmu-i}$ reaches the predefined size. The measurement of the node in the set $S_{pmu-i}$ which has the same measurement type as that to be estimated will be selected and used in the dynamic process estimation.

The step 2 further comprises the following data preprocessing:

(a) if the physical quantity to be estimated is voltage magnitude or current magnitude, when the node with PMU and the node without PMU are in different voltage levels, the voltage or current magnitude of the node with PMU is converted into that at the voltage level of the node without PMU by using rated voltage transformation ratio of two voltage levels.

(b) if the physical quantity to be estimated is voltage phase angle or current phase angle, an absolute phase angle measured by PMU directly must be converted into a relative phase angle referring to voltage phasor of a certain node in the electric island, that is, making dynamic process estimation based on relative phase angle, and the relative phase angle should be converted into the range as $-180°\sim+180°$.

(c) if the physical quantity to be estimated is voltage phase angle or current phase angle, when the node with PMU and the node without PMU are in different voltage levels, the voltage or current phase angle of the node with PMU is converted into that at the voltage level of the node without PMU in accordance with phase shift incurred by the connection type of transformer and should be converted into the range as $-180°\sim+180°$.

Step 3: initializing linear combination coefficients $b_{ij}$ between the variance $\Delta X_i$ of $X_i$ of node i without PMU and the variances $\Delta X_j$ of the corresponding measurements $X_j$ of the relevant nodes with PMU, where $X_i$ being quantity to be estimated and $j \in S_{pmu-i}$, and initializing the parameters for recursive least square method. The details of initializing are as follows:

(a) establishing recursive least square mathematic model for solving linear combination coefficients $b_{ij}$. The generic mathematical formula for problems to be solved by recursive least square method can be written as follows:

$$d = Aw + v$$

$$\underbrace{\begin{bmatrix} d(0) \\ d(1) \\ \vdots \\ d(N) \end{bmatrix}}_{d} = \underbrace{\begin{bmatrix} u_0^T \\ u_1^T \\ \vdots \\ u_N^T \end{bmatrix}}_{A} w + \underbrace{\begin{bmatrix} v(0) \\ v(1) \\ \vdots \\ v(N) \end{bmatrix}}_{v}$$

Where d is a output vector that can be observed, w is a parameter vector that is to be solved, A is a state matrix that is comprised of several vectors $u_j$, $u_j$ representing relationship between parameter vector w and measurement d(j), v is a noise vector. For the problem to solve the linear composition coefficient $b_{ij}$ of the variance of the measurement $\Delta X_i$, the variables in the above formula are defined as follows:

$d = [\Delta X_i]$, $w = [b_{i1} b_{i2} \ldots b_{ij} \ldots b_{iN_i}]^T$, $A = u^T = [\Delta X_1 \Delta X_2 \ldots \Delta X_j \ldots \Delta X_{N_i}]$ Where $\Delta X_i$ is the difference between the current value and the last value of $X_i$ obtained from SCADA measurement or state estimation. Because the dynamic processes of difference measurements are estimated one by one, output vector d has only one element in fact; $\Delta X_1 \Delta X_2 \ldots \Delta X_k \ldots \Delta X_{N_i}$ are respectively the differences between the current values and the last values of nodes in $S_{pmu-i}$ obtained from SCADA measurement or state estimation; $b_{i1} B_{i2} \ldots b_{ij} \ldots b_{iN_i}$ are the corresponding linear combination coefficients between $\Delta X_1 \Delta X_2 \ldots \Delta X_j \ldots \Delta X_{N_i}$ and $\Delta X_i$.

(b) The initial value of $b_{ij}$ is usually taken as $1/N_i$, where $N_i$ is the total number of elements in the set $S_{pmu-i}$, and hence the initial value of w is $w_{-1} = [1/N_i 2//N_i \ldots 1/N_i]^T$, where the index −1 denotes that the corresponding value is an initial value.

(c) Weighting factors are assigned to the variances of the measurement of nodes with PMU. With the weighting factors being the diagonal elements, weighting matrix 11 can be obtained, which is a diagonal matrix with $N_i \times N_i$ dimensions. The higher the data quality of the variances of the measurement of nodes with PMU is, the nearer the electric distance between the node and the node to be estimated is, so the greater the corresponding weighting factor is. In the process of solving recursive least square problem, a variable matrix P will be used, and its initial value $P_{-1}$ is taken as $\Pi$, where the index −1 denotes that the corresponding value is an initial value. When no clear idea or enough information for data quality of these nodes, preferably all weighting factors are same and are taken as 0.1, and hence P is $$P_{-1} = \begin{pmatrix} 0.1 & & 0 \\ & \ddots & \\ 0 & & 0.1 \end{pmatrix}.$$

(d) initializing forgetting factor λ, preferably being 0.99.

Step 4: For each measurement $X_i$, according to the measurement values at the most recent sampling time $T_k$ of SCADA or the calculation values at the most recent time $T_k$ of state estimation, and to corresponding historical values, the linear combination coefficient $b_{ij}(T_k)$ between the variance $\Delta X_i(T_k)$ of the quantity to be estimated of the node without PMU and the variance $\Delta X_j(T_k)$ of the corresponding measurements of the nodes with PMU at time $T_k$ can be obtained, where $j \in S_{pmu-i}$, and index k is a integer starting from 0, and denotes the number of SCADA sampling or state estimation calculation. The detailed steps thereof includes:

(a) Calculate the variance $\Delta X_i(T_k)$ of $X_i$ of the node i between time steps k and k−1, and get the output vector $d_k$ at time step k. The formula is as the following $$d_k = [\Delta X_i(T_k)] = [X_i(T_k) - X_i(T_{k-1})];$$

(b) Calculate the variances of those measurements of the nodes in $S_{pmu-i}$ between time step k and k−1, and a variable vector $u_k$ is obtained according to the following formula:, $$u_k^T = [\Delta X_1(T_k) \, \Delta X_2(T_k) \ldots \Delta X_{N_i}(T_k)] = [X_1(T_k) - X_1(T_{k-1}) \, X_2(T_k) - X_2(T_{k-1}) \ldots X_{N_i}(T_k) - X_{N_i}(T_{k-1})]$$

(c) According to the following three recursive formula, to calculate an intermediate process matrix $g_k$, parameter vector $w_k = [b_{i1}(T_k) \, b_{i2}(T_k) \ldots b_{iN_i}(T_k)]^T$, and intermediate process matrix $P_k$ for time step k of the recursive least square method. Loop variable k begins from time step 0, wherein the $P_{-1}$ and $w_{-1}$ used in the calculation at time step 0 are initialized and given in Step 3. From the $w_k$ obtained at time step k, the linear combination coefficients $b_{ig\,(Tk)}$ at time step k can be obtained.

$$g_k = \frac{\lambda^{-1} P_{k-1} u_k}{1 + \lambda^{-1} u_k^T P_{k-1} u_k}$$

$$w_k = w_{k-1} + g_k [d_k - u_k^T w_{k-1}]$$

$$P_k = \lambda^{-1} [P_{k-1} - g_k u_k^T P_{k-1}]$$

Step 5: According to the linear combination coefficient $b_{ij}(T_k)$ at time $T_k$ obtained in step 4 based on data from SCADA measurement or state estimation, the variance of $X_i(t)$ at each time of PMU sampling relative to $X_i(T_k)$ can be calculated by the followings formula $$\Delta X_i(t) = \sum_{j \in S_{pmu-i}} b_{ij}(T_k) \Delta X_j(t), \text{ with } T_k < t < T_{k+1}$$

where $X_j(t)$ is the measurement value from the node j with PMU at PMU sampling time t.

Then the estimated value of quantity $X_i$ of the node i without PMU at time t can be obtained by the following formula:

$$X_i(t) = \Delta X_i(t) + X_i(T_k),$$

with $$T_k < t < T_{k+1}$$

The estimated relative phase angle should be converted into the rang as −180°∼+180°; or the estimated relative phase angle is first transformed into absolute phase angle, then is converted into the range as −180°∼+180°.

For the time point at which there is SCADA measurement or state estimation value, the quantity to be estimated of the node without PMU can assume the SCADA measurement or state estimation value.

It should be noted that, in the step 5 above, during the period between two SCADA sampling or two state estimation calculation, a short or break-off fault may occur in the power grid, then the Jacobian matrix or the node admittance matrix will change, and the effect of nodes with PMU on the node without PMU may have a great change. However the linear combination coefficients cannot be changed at once because the renew of the data from the telemetry of SCADA or state estimation calculation may have a great delay while the telesignalization of SCADA for breaker status may have much faster reporting rate. In order to reduce the above mentioned error, when a line connected directly to the node i without PMU or the nodes $j(j \in S_{pmu-i})$ with PMU is in short or open circuit, topology analysis is called at once and one of the following three actions is done according to the topology analysis results.

(a) If a node j with PMU is separated from the system, then its linear combination coefficient is set to zero, and its original value is divided averagely and added to the combination coefficients of the other nodes with PMU.

(b) If a node i without PMU is separated from the system, then $X_i$ is set to zero, and that means the dynamic process of this node cannot be estimated during the period that the node i is separated from the system. If the node i is reconnected to the system, then the dynamic process is estimated by employing the linear combination coefficient before separated as initial $b_{ij}$.

(c) In other cases, system faults don't cause node i without PMU or any node j ($j \in S_{pmu-i}$) with PMU is separated from the system, and hence no special action is done. That is, the linear combination coefficients are revised by the renewal of SCADA measurement or state estimation data at time step k+1 to reflect the change of grid structure.

Step 6: When a new data coming out from SCADA measurement or state estimation, return to Step 4 and renew the linear combination coefficient.

The present invention is only based on the dynamic measurement data of nodes with PMU and SCADA data or the results of state estimation in real-time, and is independent of grid parameters and state matrix (or Jacobian matrix) renewal, and doesn't need the nodes without PMU to be completely observable, as a result, the real-time estimation of the dynamic process of node without PMU is achieved at PMU sampling time point, and thus the defects of the existing method for estimating dynamic process are overcome, i.e. large computing burden, time consuming, and bad precision, because its precision strongly depends on the accuracy of the grid parameters and Jacobian matrix. By the present method, the stronger the linear combination relationship is, the smaller the error for dynamic process estimation is. For example, for the dynamic process estimation of voltage phasors, the errors of magnitude are ±0.05%, and the errors of phase angles are ±0.05°. If the linear combination relationship is weaker, the error for dynamic process estimation will become larger. For example, in the dynamic process estimation of active power during low frequency oscillation, the error usually is ±5%, but it is still in the range that can be accepted in engineering. If the time interval between two successive SCADA samplings or state estimation calculations is reduced, the errors for dynamic process estimation will be further decreased.

DETAILED DESCRIPTION OF THE PREFERRED EMBODIMENTS

Figure 1:
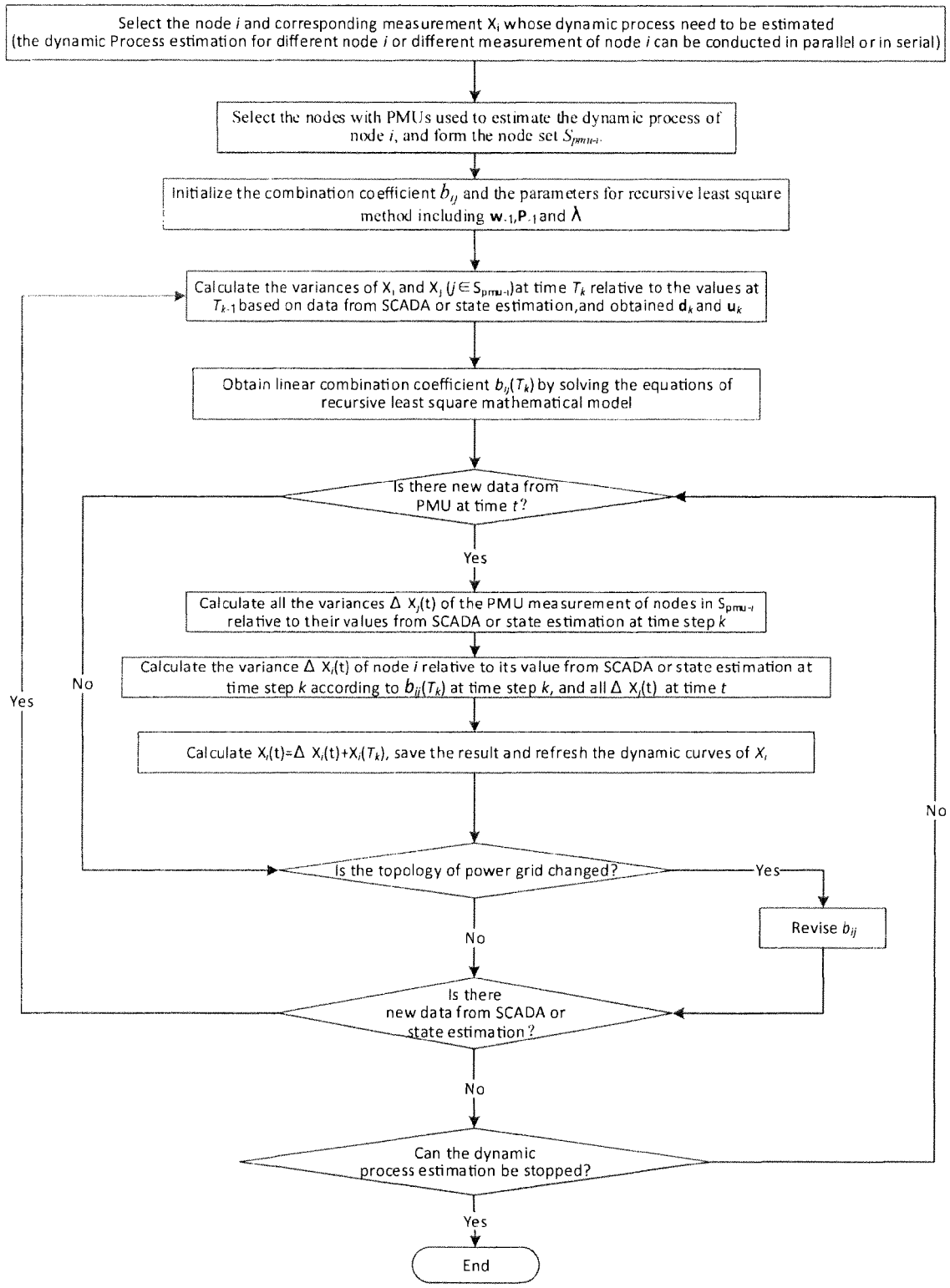
FIG. 1 is a flow chart of a real-time and state-matrix-independent dynamic process estimation method for weakly observable measurement nodes without PMU.

The method disclosed in the present invention is only based on the dynamic measurement data of nodes with PMU and SCADA data or the results of state estimation in real-time, and is independent of grid parameters and state matrix (or Jacobian matrix) renewal, and doesn't need the nodes without PMU to be completely observable, as a result, the real-time estimation of the dynamic process of node without PMU is achieved. The basic idea of the method is based on the fact that the variance of a measurement may be approximately obtained by the linear combination of the variances of some related measurements, that is $$\Delta X_i(t) = \sum_{j \in S_{pmu-i}} b_{ij} \Delta X_j(t) \quad (1)$$

where $X_i$ is a measurement of certain a dynamic process to be estimated at node i, and it may be voltage magnitude, voltage phase angle, current magnitude, current phase angle, active power, reactive power, frequency, generator speed and etc; $\Delta X_i(t)$ denotes the variance of $X_i$ at time t; The node set $S_{pmu-i}$ is comprised of nodes which are nearer to the node i in electric distance and have PMU, for example the topology nodes in substations or power plants. Although it is preferred that the nodes in $S_{pmu-i}$ are nearer to the node i, but this is not a strict requirement. From the embodiments introduced hereinafter, it can be seen that the dynamic process estimation of the node i may be also achieved by use of the nodes that are farther from the node i in electric distance but still in the same electric island, even though the errors become greater but are still in the acceptable range for engineering applications; $X_j$ is a measurement of the node j in the set $S_{pmu-i}$ and has the same measurement type as $X_i$; $b_{ij}$ is the linear combination coefficient between the variances of the related measurements.

There is no strict requirement for the size of the set $S_{pmu-i}$. It can be seen from equation (1) that the member in $S_{pmu-i}$ cannot be 1, otherwise the dynamic process of $X_i$ will be always the same as that of $X_j$. In order to reflect the effects of all kinds of factors on the shape and magnitude of the dynamic process curves of node to be estimated, it is better for the nodes in $S_{pmu-i}$ to have a wider distribution in the power grid. However, more nodes in $S_{pmu-i}$ means more computing burden, and it will lower the real-time performance of the online dynamic process estimation. It is concluded from plenty of tests that 4 to 6 members in set $S_{pmu-i}$ are most suitable for engineering applications.

It should be noted that the linear combination relationship expressed in equation (1) is experiential, not strictly mathematical. Therefore, it is not only suitable for voltage phasors whose variances have strong linear relationship therebetween, but also for those variables whose variances have weak or no linear relationship., e.g. active power and frequency. The users of the method don't need to know the linearization mathematical model, and all the linearization coefficients are learned from historical data by recursive least square method. It is proved by plenty of real data from engineering that, when the variances of measurements have strong linear relationship, the error of dynamic process estimation will be very small. For example, for the dynamic process estimation of voltage magnitude, the errors are usually in the range of ±0.05%, while the errors for the dynamic process estimation of voltage angle are usually in the range of ±0.05°. When the variances of measurements have weaker linear relationship, the error of dynamic process estimation will be greater relatively, but usually is still in an acceptable error range in engineering. For example, for the dynamic process estimation of active power during low frequency oscillation events, the estimation errors usually can be retained in the range of ±5%. If the time interval between two successive SCADA samplings or state estimation calculations is reduced, for example, from 5 s to 1 s, the errors for dynamic process estimation can be further decreased.

Based on equation (1) and the basic theory described above, by using the data from SCADA measurement or state estimation at many successive time points, the linear combination coefficients between the variation of quantity to be estimated of node without PMU and the variations of measurements of nodes with PMU can be found. Based on the linear combination coefficients, the values of the quantity to be estimated of node without PMU can be estimated at each PMU sampling time, so that the real-time estimation of the dynamic process of the quantity of the node without PMU is achieved.

Regarding to the sources of the data sequence of quasi-steady state, if only the dynamic processes of voltage magnitudes, current magnitudes, active power, reactive power, and frequency etc. are estimated, only data from SCADA may be used, and the time interval between two successive quasi-steady states are usually from 1 second to 5 seconds; If the dynamic process of the voltage phase angle or current phase angle also needs to be estimated, then the results from state estimation are necessary, because there is no phase angle measurement for SCADA up to date. The time intervals between two successive quasi-steady states are dependent on not only the sampling speed of SCADA but also on the computing efficiency of state estimation. For the application of dynamic process real-time estimation, it may be set as 5 seconds. Moreover, if SCADA and PMU/WAMS (Wide area measurement system) can acquire generator speed and other non-electric quantities from power system, then the method proposed in this invention may be also used for the dynamic process estimation of such non-electric quantities.

For the equation (1), the reason for recursive least square method being used to solve the coefficients $b_{ij}$ is, on the one hand, the recursive method can solve combination coefficients $b_{ij}$ at once when a new quasi-steady state obtained from SCADA or state estimation, and this will guarantee the algorithm to be real-time. On the other hand, equation (1) satisfies the following general formula (2) of the problems that are suitable to be solved by recursive least square method.

$$d = Aw + v \quad (2)$$

$$\underbrace{\begin{bmatrix} d(0) \\ d(1) \\ \vdots \\ d(N) \end{bmatrix}}_{d} = \underbrace{\begin{bmatrix} u_0^T \\ u_1^T \\ \vdots \\ u_N^T \end{bmatrix}}_{A} w + \underbrace{\begin{bmatrix} v(0) \\ v(1) \\ \vdots \\ v(N) \end{bmatrix}}_{v}$$

Where d is a output vector that can be observed, w is a parameter vector that is to be solved, A is a state matrix that is comprised of several vectors $u_j$, $u_j$ representing relationship between parameter vector w and measurement $d(j)$, v is a noise vector. It can be observed that for equation (1) and equation (2), their variables have the following mapping relationships, $d = [\Delta X_i]$, $w = [b_{i1} b_{i2} \ldots b_{ij} \ldots b_{iN_i}]^T$, $A = u^T = [\Delta X_1 \Delta X_2 \ldots \Delta X_j \ldots \Delta X_{N_i}]$ Where $\Delta X_i$ is the difference between the current value and the last value of $X_i$ obtained from SCADA measurement (or state estimation). Because the dynamic processes of difference measurements are estimated one by one, output vector d has only one element in fact; ; $\Delta X_1 \Delta X_2 \ldots \Delta X_k \ldots \Delta X_{N_i}$ are respectively the differences between the current values and the last values of nodes in $S_{pmu-i}$ obtained from SCADA measurement or state estimation; $b_{i1} B_{i2} \ldots b_{ij} \ldots b_{iN_i}$ are the corresponding linear combination coefficients between $\Delta X_1$ $\Delta X_2 \ldots \Delta X_j \ldots \Delta X_{N_i}$ and $\Delta X_i$. Because equation (1) actually has the formulation of equation (2), recursive least square method can be used to solve equation (1) and obtain the combination coefficients $b_{ij}$.

In real systems, a dynamic process estimation software based on this invention may be deployed in the following typical environment of software and hardware. The dynamic process estimation software will run in the advanced application server of a wide area measurement system (WAMS) in a control center. It acquires SCADA data or state estimation data for current quasi-steady state from a real-time database of SACADA/EMS. Then recursive least square method is used to find out the linear combination coefficients for all the measurements whose dynamic process need to be estimated. Before obtaining the data for the next quasi-steady state, at each PMU sampling time, the linear combination coefficients obtained at the latest quasi-steady state and the related PMU data acquired from the real-time database of WAMS are used to estimate the corresponding quantity of the node without PMU. The estimation results are stored in real-time database of WAMS as if they are measurements from real PMUs besides that, for each such measurement, there is a tag to indicate it is a measurement with its PMU data being from process estimation instead of being obtained from real PMU.

Hereinafter, the detailed steps of this invention are described by using real data as examples. A program flowchart of the invention is shown in FIG. 1. To verify the validity of the invention, in the following examples, the nodes whose dynamic processes are to be estimated are equipped with PMUs actually. In this way, comparisons can be made between the values from estimation and those from PMU, and the validity of the invention can be verified. The detailed steps for this invention are as follows:

(1) Selecting nodes i without PMU and their physical quantities $X_i$ of which dynamic process needing to be estimated. For example, the physical quantity may be voltage magnitude, voltage phase angle, current magnitude, current phase angle, active power, reactive power, frequency, and/or rotating speed of generator.

(2) for each node i without PMU, selecting a set of nodes with PMUs $S_{pmu-i}$ for estimating the dynamic process thereof. The set of nodes are usually comprised of a number of nodes with PMU from which the electric distances to the node i without PMU are nearer than others, either designated by operator or determined by automatic search. An automatic search method is: the minimum number of line segments between each node with PMU and the node i being calculated automatically according to topological information; then, first adding the nodes with PMU that are connected to the node i by a segment of line into the set $S_{pmu-i}$; after that, adding in turn the nodes with PMU that are connected by two, three, and four segments of line respectively into the set $S_{pmu-i}$, until the number of nodes in the set $S_{pmu-i}$ reaches 4~6 (the size of the set being predefined as per actual situation). The measurement of the node in the set $S_{pmu-i}$ which has the same measurement type as that to be estimated will be selected and used in the dynamic process estimation. For different quantities to be estimated, the following data preprocessing may be applied to the original measurement data:

(2.a) if the physical quantity to be estimated is voltage magnitude or current magnitude, when the node with PMU and the node without PMU are in different voltage levels, the voltage or current magnitude of the node with PMU is converted into that at the voltage level of the node without PMU by using rated voltage transformation ratio of two voltage levels.

(2.b) if the physical quantity to be estimated is voltage phase angle or current phase angle, a absolute phase angle measured by PMU directly must be converted into a relative phase angle referring to voltage phasor of a certain node in the electric island, that is, making dynamic process estimation based on relative phase angle, and the relative phase angle should be converted into the range as $-180°\sim+180°$.

(2.c) if the physical quantity to be estimated is voltage phase angle or current phase angle, when the node with PMU and the node without PMU are in different voltage levels, the voltage or current phase angle of the node with PMU is converted into that at the voltage level of the node without PMU in accordance with phase shift incurred by the connection type of transformer and should be converted into the range as −180°~+180°.

(3) For each node i without PMU, initializing the corresponding linear combination coefficients $b_{ij}$ and the parameters for recursive least square method.

(3.a) The initial value of $b_{ij}$ is usually taken as $1/N_i$, where $N_i$ is the total number of elements in the set $S_{pmu-i}$, and this is also to initialize the unknown phasor w of the recursive least square method, hence $w_{-1}=[1/N_i \ldots 1/N_i]^T$, where the index −1 denotes that the corresponding value is an initial value.

(3.b) Weighting factors are assigned to the variances of the measurement of nodes with PMU. With the weighting factors being the diagonal elements, weighting matrix Π can be obtained, which is a diagonal matrix with $N_i \times N_i$ dimensions. The higher the data quality of the variances of the measurement of nodes with PMU is, the nearer the electric distance between the node and the node to be estimated is, so the greater the corresponding weighting factor is. In the process of solving recursive least square problem, a variable matrix P will be used, and its initial value $P_{-1}$ is taken as Π, where the index −1 denotes that the corresponding value is an initial value. When no clear idea or enough information for data quality of these nodes, preferably all weighting factors are same and are taken as 0.1, and hence P is $$P_{-1} = \begin{pmatrix} 0.1 & & 0 \\ & \ddots & \\ 0 & & 0.1 \end{pmatrix}$$

(3.c) initializing forgetting factor λ, preferably being 0.99.

(4) For each quantity to be estimated $X_i$, the following loop is applied: for each latest quasi-steady state at time step k, the combination coefficients $b_{ij}$ are calculated according to the following steps by use of the corresponding values of SCADA measurement or state estimation, and then the dynamic process (curve) of the quantity to be estimated until the next time step is estimated by use of the dynamic measurement data of the nodes with PMU.

(4.a) Calculate the variance $\Delta X_i(T_k)$ of $X_i$ of the node i between time steps k and k−1, and get the output vector $d_k$ at time step k. The formula is as the following $$d_k = [\Delta X_i(T_k)] = [X_i(T_k) - X_i(T_{k-1})]$$

(4.b) Calculate the variances of those measurements of the nodes in $S_{pmu-i}$ between time step k and k−1, and a variable vector $u_k$ is obtained according to the following formula:

$$u_k^T = [\Delta X_1(T_k) \, \Delta X_2(T_k) \ldots \Delta X_{N_i}(T_k)] = [X_1(T_k) - X_1(T_{k-1}) \, X_2(T_k) - X_2(T_{k-1}) \ldots X_{N_i}(T_k) - X_{N_i}(T_{k-1})]$$

(4.c) Calculate the matrix $g_k$ according to the following formula, $$g_k = \frac{\lambda^{-1} P_{k-1} u_k}{1 + \lambda^{-1} u_k^T P_{k-1} u_k}$$

(4.d) Calculate $w_k = [b_{i1}(T_k) \, b_{i2}(T_k) \ldots b_{iN_i}(T_k)]^T$ according to the following formula to get individual linear combination coefficients $b_{ij}(T_k)$, $$w_k = w_{k-1} + g_k[d_k - u_k^T w_{k-1}]$$

(4.e) Solve the matrix $P_k$ according to the following formula, that is to make preparation for the solving of the combination coefficient at the next time step $T_{k+1}$ $$P_k = \lambda^{-1}[P_{k-1} - g_k u_k^T P_{k-1}]$$

(4.f) For each sampling time t of PMU, where $T_k < t < T_{k+1}$, execute the following loops until the time step $T_{k+1}$:

i) At each sampling time t of PMU, calculate the variances of $X_j(t)$ of the nodes in the set $S_{pmu-i}$ relative to the values at time $T_k$ according to the following formula $$\Delta X_j(t) = X_j(t) - X_j(T_k),$$

where $$T_k < t < T_{k+1}.$$

ii) Based on the linear combination coefficient $b_{ij}(T_k)$ obtained in step (4.d), the variance of $X_i(t)$ at each sampling time of PMU relative to $X_i(T_k)$ can be calculated out by the followings formula $$\Delta X_i(t) = \sum_{j \in S_{pmu-i}} b_{ij}(T_k) \Delta X_j(t), \text{ where } T_k < t < T_{k+1}.$$

iii) Then the estimated value of quantity $X_i$ of the node i without PMU at time t can be obtained by the following formula: $X_i(t) = \Delta X_i(t) + X_i(T_k)$, with $T_k < t < T_{k+i}$. The estimated relative phase angle should be converted into the rang as −180°~+180°; or the estimated relative phase angle is first transformed into absolute phase angle, then is converted into the range as −180°~+180°.

For the time point at which there is SCADA measurement or state estimation value, the quantity to be estimated of the node without PMU can assume the SCADA measurement or state estimation value.

iv) Save the current estimation result $X_i(t)$ of node i, and redraw the dynamic curves of $X_i$ if necessary.

v) Judge if there are any other quantities whose dynamic process need to be estimated at the current PMU sampling time t, if YES, then return to step i), otherwise proceed to step vi).

vi) During the period $T_k < t < T_{k+i}$, that is the period between two SCADA sampling or two state estimation calculation, if there are breaker status changes reported from SCADA, then topology analysis is called at once. when a line connected directly to the node i without PMU or the nodes $j(j \in S_{pmu-i})$ with PMU is in short or open circuit, one of the following three actions is done.

(a) If a node j with PMU is separated from the system, then its linear combination coefficient is set to zero, and its original value is divided averagely and added to the combination coefficients of the other nodes with PMU.

(b) If a node i without PMU is separated from the system, then $X_i$ is set to zero, and that means the dynamic process of this node cannot be estimated during the period that the node i is separated from the system. If the node i is reconnected to the system, then the dynamic process is estimated by employing the linear combination coefficient before separated as initial $b_{ij}$.

(c) In other cases, system faults don't cause node i without PMU or any node j ($j \in S_{pmu-i}$) with PMU is separated from the system, and hence no special action is done. That is, the linear combination coefficients are revised by the renewal of SCADA measurement or state estimation data at time step k+1 to reflect the change of grid structure.

vii) Judge whether there are new data for the next time step $T_{k+1}$ coming out from SCADA or state estimation. If it is YES, then break the loop of (4.f) and return to (4.a) to start to calculate the new combination coefficients $b_{ij}(T_{k+1})$ of all the quantities $X_i$ whose dynamic process need to be estimated. Otherwise, return to the step i), and wait for the next PMU sampling time and calculate the values of the quantities whose dynamic process need to be estimated based on the combination coefficient $b_{ij}u(T_k)$ obtained at time $T_k$.

Hereinafter, several real examples are used to verify the validity of the invention, and all the measurement data are from real PMU and SCADA. To check the accuracy of the dynamic process estimation of the invention, the nodes to be estimated also has PMU, therefore the estimation result of the dynamic process can be compared with the real one measured by PMU, and relative error curves and absolute error curves (used for the error assessment of angle measurement) can be obtained. The sampling time period of PMU is 20 milliseconds, while the sampling time period of SCADA is about 1 second or 5 seconds. The formula for relative error is as follows $$\text{Relative error} = (\text{estimation value} - \text{measurement value})/\text{measurement value} \quad (3)$$

The formula for absolute error is as follows $$\text{Absolute error} = \text{estimation value} - \text{measurement value} \quad (4)$$

EXAMPLE 1

Figure 2:
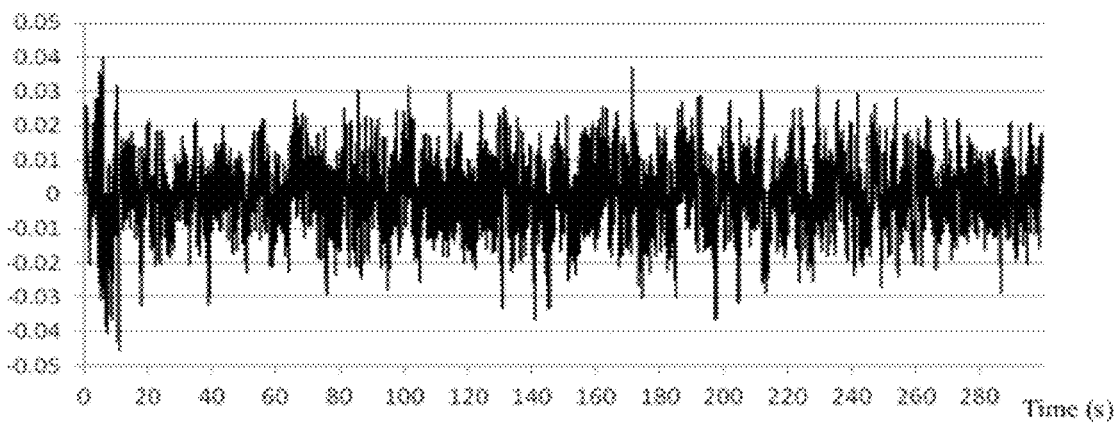
FIG. 2 illustrates a relative error curve between dynamic process estimation values and measurement values of voltage magnitude of Feng-Guang line at Guanggu substation, with near PMU nodes being used and SCADA period being 1 second.

Four substations with PMU nearer to Guanggu substation of Hubei province are selected to estimate the dynamic process of the voltage magnitude at the Guanggu side of Fengguang line on 500 kV voltage level; the four substations are Cihu, Daji, Xianning, and Yuxian substations. The voltage magnitudes of 500 kV buses in the four substations are selected to make the dynamic process estimation, and these buses are connected to the node to be estimated of Fengguang line at Guanggu side by only one transmission line directly or by two series transmission lines indirectly. When the sampling period of SCADA is 1 second, the relative error curve between dynamic process estimation values and measurement values of voltage magnitude of Feng-Guang line at Guanggu substation is shown in FIG. 2. It can be seen that for the first 300 seconds of the dynamic process estimation, the relative error falls in the range of (−0.0456%, 0.0399%).

EXAMPLE 2

Figure 3:
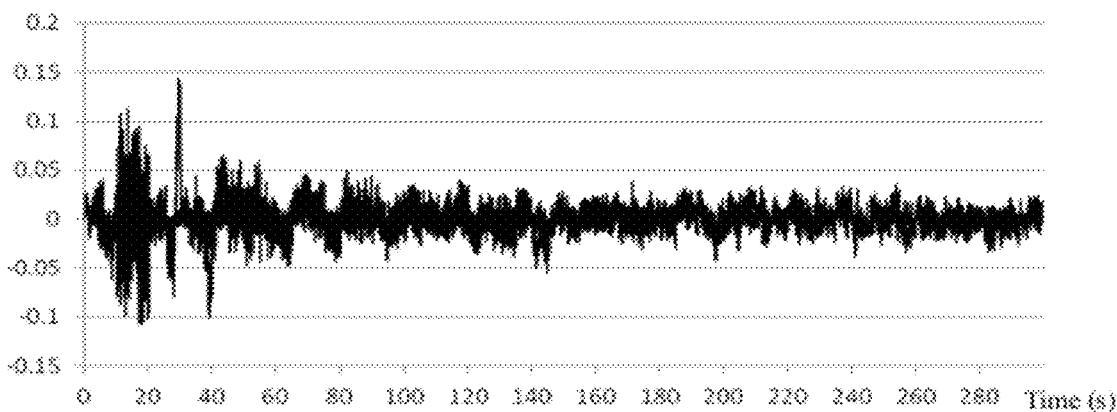
FIG. 3 illustrates another relative error curve between dynamic process estimation values and measurement values of voltage magnitude of Feng-Guang line at Guanggu substation, with near PMU nodes being used and SCADA period being 5 seconds.

Under the same measurement environment as example 1 except that the sampling period of SCADA is changed to 5 second, the relative error curve between dynamic process estimation values and measurement values of voltage magnitude of Feng-Guang line at Guanggu substation is shown in FIG. 3. It can be seen from the relative error curve that the relative error of dynamic process estimation falls in the range of (−0.11%, 0.14%). Although the error range expanded by 2~3 times than that of example 1, 60 seconds (12 times of SCADA sampling) later after the recursive estimation program starts up, the errors can fall in the range of (−0.05%, 0.05%). Considering the recursive estimation program will run continuously after starting up in reality, the relatively greater error during the starting phase of the recursive algorithm can be ignored, hence the relative error for this situation can be thought in the range of (−0.05%, 0.05%).

EXAMPLE 3

Figure 4:
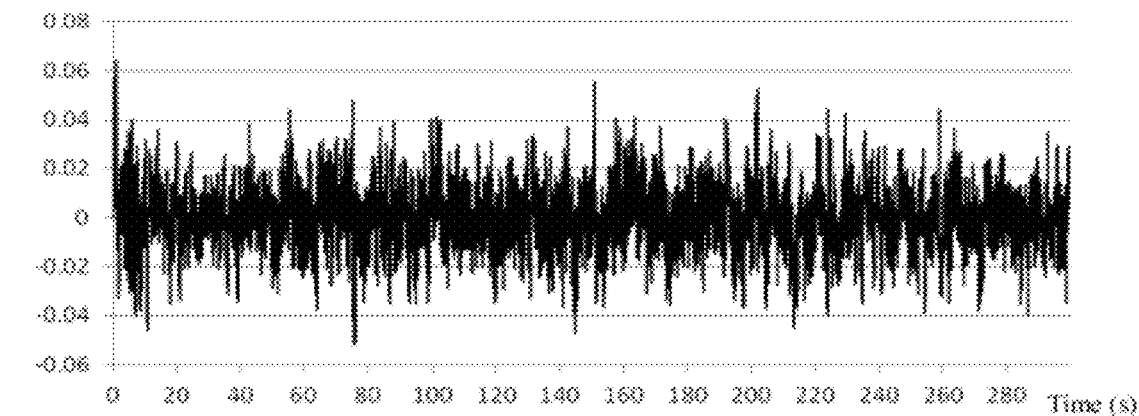
FIG. 4 illustrates yet another relative error curve between dynamic process estimation values and measurement values of voltage magnitude of Feng-Guang line at Guanggu substation, with far PMU nodes being used and SCADA period being 1 second.

Four substations with PMU relatively farther to Guanggu substation of Hubei province are selected to estimate the dynamic process of the voltage magnitude at the Guanggu side of Fengguang line on 500 kV voltage level; the four substations are Dabieshan, Shuanghe, Xiaogan, and Xinglong substations. The voltage magnitudes of 500 kV buses in the four substations are selected to make the dynamic process estimation, and these buses are connected to the node to be estimated of Fengguang line at Guanggu side by 2 to 5 series transmission lines indirectly. When the sampling period of SCADA is 1 second, the relative error curve between dynamic process estimation values and measurement values of voltage magnitude of Feng-Guang line at Guanggu substation is shown in FIG. 4. It can be seen that for the first 300 seconds of the dynamic process estimation, the relative error falls in the range of (−0.0520%, 0.0639%).

EXAMPLE 4

Figure 5:
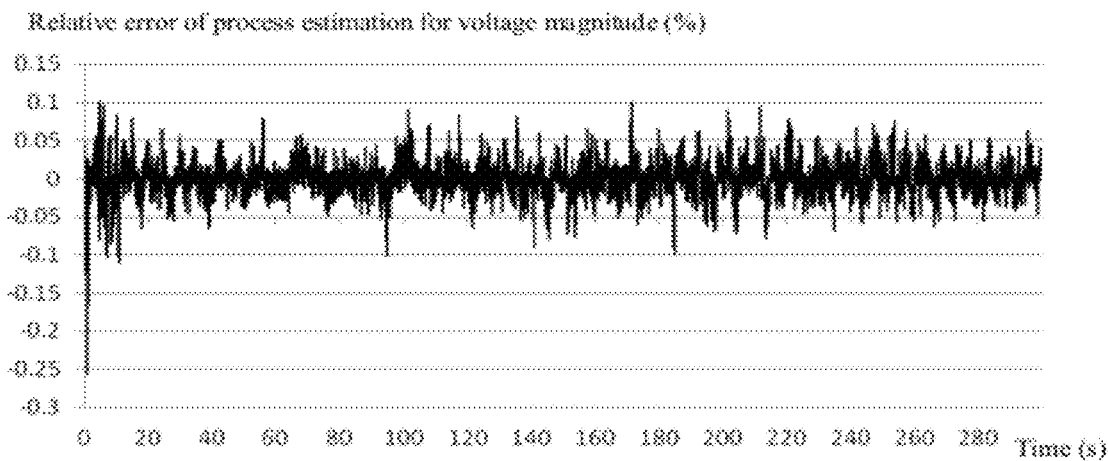
FIG. 5 illustrates a relative error curve between estimation values and measurement values of voltage magnitudes of 4# bus at the 220 kV side of Guanggu substation with the PMU measurements at 500 kV side being used.

The estimated node changes to the bus at 220 kV side of Guanggu substation. Four substations with PMU in Hubei province are selected to estimate the dynamic process of the voltage magnitude of the 220 kV bus of Guanggu substation; the four substations are Cihu, Daji, Xianning, and Yuxian substations. The voltage magnitudes of 500 kV buses in the four substations are selected to make the dynamic process estimation, and these buses are connected to the node to be estimated by 2 to 5 series transmission lines besides the 500 kV/220 kV transformer. When the sampling period of SCADA is 1 second, the relative error curve between dynamic process estimation values and measurement values of voltage magnitude of 220 kV bus at Guanggu substation is shown in FIG. 5. It can be seen that 20 seconds later after the estimation program starts up, the relative error can fall in the range of (−0.10%, 0.0997%), or simply noted as (−0.10%, 0.10%). Considering the recursive estimation program will run continuously after starting up in reality, the relatively greater error during the starting phase of the recursive algorithm can be ignored, hence the relative error for this situation can be thought in the range of (−0.1%, 0.1%) in reality.

EXAMPLE 5

Figure 6:
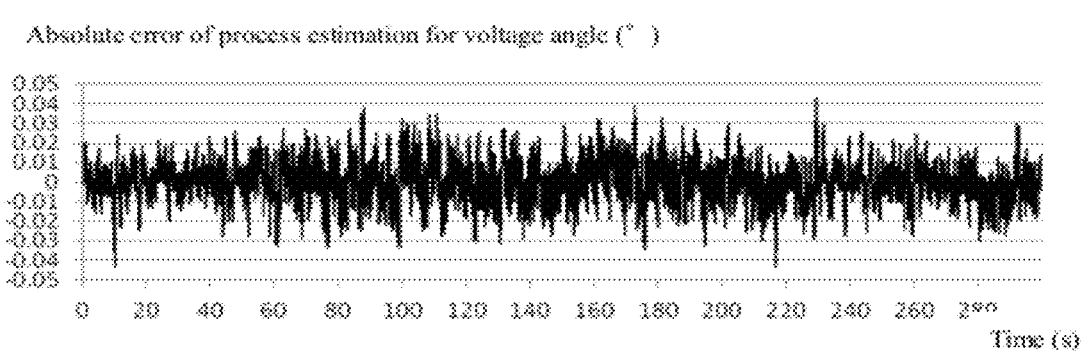
FIG. 6 illustrates an absolute error curve between dynamic process estimation values and measurement values of voltage phase angle of Feng-Guang line at Guanggu substation.

Four substations with PMU nearer to Guanggu substation of Hubei province are selected to estimate the dynamic process of the voltage angle at the Guanggu side of Fengguang line on 500 kV voltage level; the four substations are Cihu, Daji, Xianning, and Yuxian substations. The voltage angles of 500 kV buses in the four substations are selected to make the dynamic process estimation. When the calculation period of state estimation is 1 second, the absolute error curve between dynamic process estimation values and measurement values of voltage angle of Feng-Guang line at Guanggu substation is shown in FIG. 6. It can be seen that for the first 300 seconds of the dynamic process estimation, the absolute error of the estimated angle falls in the range of (−0.043°, 0.0426°).

EXAMPLE 6

Figure 7:
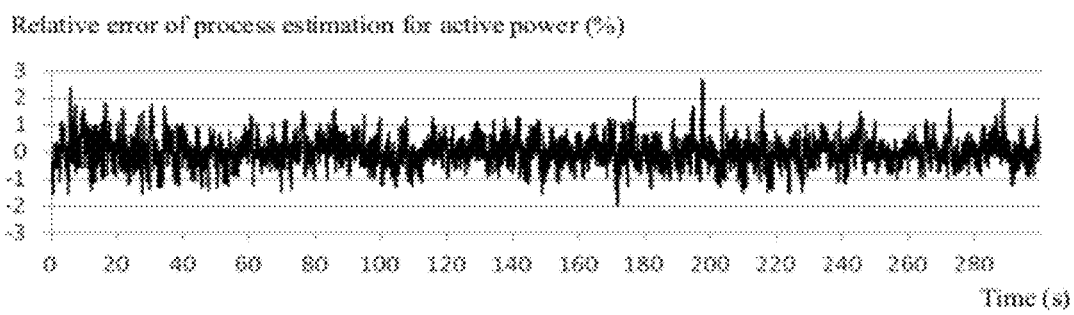
FIG. 7 illustrates a relative error curve between dynamic process estimation values and measurement values of active power of Feng-Guang line at Guanggu substation.

Four substations with PMU nearer to Guanggu substation of Hubei province are selected to estimate the dynamic process of the active power at the Guanggu side of Fengguang line on 500 kV voltage level; the four substations are Cihu, Daji, Xianning, and Yuxian substations. The active powers of four 500 kV transmission lines in the four substations respectively are selected to make the dynamic process estimation. When the sampling period of SCADA is 1 second, the relative error curve between dynamic process estimation values and measurement values of active power of Feng-Guang line at Guanggu substation is shown in FIG. 7. It can be seen that for the first 300 seconds of the dynamic process estimation, the relative error of the estimated active power falls in the range of (−1.95%, 2.72%).

EXAMPLE 7

Figure 8:
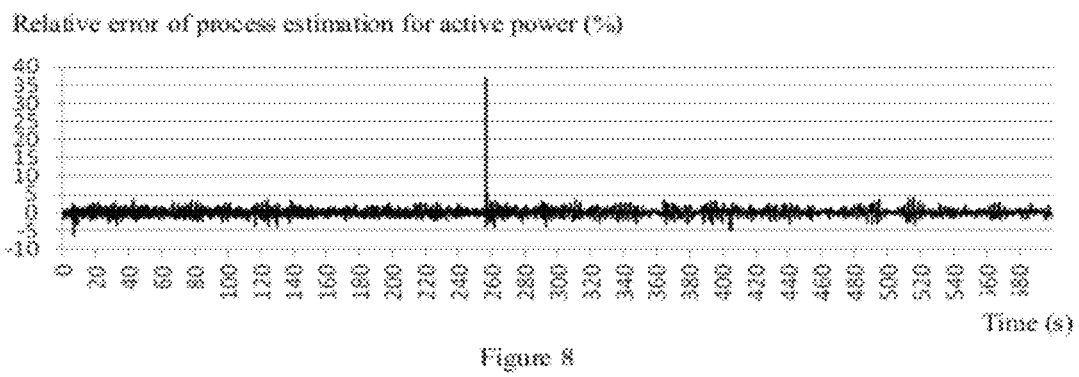
FIG. 8 illustrates a relative error curve between dynamic process estimation values and measurement values of the active power of Wanlong I line before and during a low frequency oscillation event with the PMU measurements and the quantity to be estimated in different coherent area.

A real low frequency oscillation event is used to verify the capability of the invention to make dynamic process estimation for active power measurements in realtime. The active power of Wanlong I line in 500 kV voltage level is selected to be estimated. In order to check the accurate of the invention in extremely disadvantage situation, the active power of four 500 kV transmission lines that are not in the same coherent area with Wanlong I lines during the low frequency oscillation are selected to make the process estimation of the active power of Wanlong I line before and during the low frequency oscillation event. The four lines are Changnan I line, Gegang line, Jiangfu I line, Jiangling I line. The relative error curve between dynamic process estimation values and measurement values of the active power of Wanlong I line is shown in FIG. 8. The disturbance occurred at the time of 256.58 s in the figure, then a low frequency oscillation with the main oscillation mode of 0.47 Hz was activated. It can be seen from FIG. 8 that the relative error of the dynamic process estimation for active power is in the range of (−5%, +5%), except during the very short period (less than 0.1 second) after the disturbance at 256.58 s and the short period after the start of the recursive least square method.

From the above examples with field data, the following conclusions can be obtained or verified:

(1) From example 1 and example 5, it can be seen that when the variances of measurements have strong linear relationship, the error of dynamic process estimation by this invention will be very small. For example, for the dynamic process estimation of voltage phasors, the relative errors of voltage magnitudes are usually in the range of (−0.05%, 0.05%), and the absolute error of voltage angles are usually in the range of (−0.05°, 0.05°).

(2) By the comparison of example 1 and example 2, it can be seen that by reducing the sampling period between two successive quasi-steady states, the accuracy of dynamic process estimation can be improved. Moreover, it can be concluded from example 2 that the accuracy of the invention is high enough for engineering applications even though the sampling period is 5 seconds that is usually the greatest sampling period for modern SCADA.

(3) It can be concluded from example 3 that even though the process estimation error become larger when the PMU measurement is farer from the measurement to be estimated, however it is not obvious. That means if there are no PMU measurements near the measurement to be estimated, PMU measurements far from the measurement to be estimated can be used to make the dynamic process estimation, if only they are in the same electric island.

(4) It can be concluded from example 4 that measurements in different voltage levels can still be used to make dynamic process estimations, and the accuracies of estimations are still very high.

(5) It can be concluded from example 5, that the absolute errors for the process estimation of voltage angles are in the range of (−0.05°, 0.05°), and that is a high accuracy for angle estimation. The reason is that the variances of different voltage angles have strong linear relationship.

(6) It can be concluded for example 6 and example 7 that the errors for process estimations of active power are relatively greater compared with those of process estimations of voltages. That is because the variances of different active powers have weaker linear relationship. However, the errors are still in the acceptable range for engineering applications. For example, in the extremely disadvantageous situation shown in example 7, the relative error for process estimation of active power can still be in the range of (−5%, +5%).

(7) It also can be concluded from all the above examples that the process estimation errors are relatively greater during the starting period of the recursive least square method, that is because the initial estimation for the linear combination coefficients usually have greater errors. With the progress of the dynamic process estimation, the estimation for the linear combination coefficient can be improved gradually, and hence the error for dynamic process estimation can be improved greatly after the period for starting up of the recursive method.

The invention claimed is:

1. A method for estimating a dynamic process of nodes without Phasor Measurement Unit (PMU) in real time in a power grid using only dynamic measurements of nodes with PMU and Supervisory Control And Data Acquisition (SCADA) measurement data or state estimation data, which is independent of grid parameters and renewal of state matrix, without relying on the estimated nodes to be observable when the estimated nodes and the nodes with PMU are in a same electric island, wherein the method uses recursive least square for locating a linear combination relationship between variances of measurement nodes without PMU and variances of measurement nodes with PMU from quasi-stable state data sequence during a period of time, including SCADA measurement data or state estimation data at a number of consecutive time points, and subsequently estimating the dynamic process of the node without PMU in real time based on the linear combination relationship, the method comprising steps:

Step 1: selecting, by at least one processor of a wide area measurement system (WAMS) server in a control center for the power grid, nodes i without PMU and their physical quantities $X_i$ of which dynamic process to be estimated, wherein the physical quantity is one selected from a set comprising voltage magnitude, voltage phase angle, current magnitude, current phase angle, active power, reactive power, frequency, and rotating speed of generator;

Step 2: for each node i without PMU, selecting, by the at least one processor, a set of nodes with PMUs $S_{pmu-i}$ for estimating the dynamic process, the set of nodes comprising a number of nodes with PMU from which the electric distances to the node i without PMU are nearer than others, while ensuring nodes with PMU are in a same electric island with the node i to be estimated, the nodes in the set $S_{pmu-i}$ are selected according to node impedance matrix calculated offline in typical operation mode, or designated by operator, or determined by online automatic search according to minimum number of line segments that connect the node with PMU to the node without PMU, the measurements of the nodes in the set $S_{pmu-i}$ which have the same measurement type as that to be estimated will be selected and used in the dynamic process estimation;

Step 3: initializing, by the at least one processor, linear combination coefficients $b_{ij}$ between the variance $\Delta X_i$ of $X_i$ of node i without PMU and the variances $\Delta X_j$ of the corresponding measurements $X_j$ of the relevant nodes with PMU, where $X_i$ being quantity to be estimated and $j \in S_{pmu-i}$, and initializing the parameters for recursive least square method;

Step 4: for each measurement $X_i$, according to the measurement values at sampling time $T_k$ of SCADA or the calculation values at the time $T_k$ of state estimation, and to corresponding historical values, obtaining, by the at least one processor, the linear combination coefficient $b_{ij}(T_k)$ between the variance $\Delta X_i(T_k)$ of the quantity to be estimated of the node without PMU and the variance $\Delta X_j (T_k)$ of the corresponding measurements of the nodes with PMU at the time $T_k$, where $j \in S_{pmu-i}$, and index k is a integer starting from 0, and denotes the number of SCADA sampling or state estimation calculation;

Step 5: according to the linear combination coefficient $b_{ij}(T_k)$ at the time $T_k$ obtained in step 4 based on data from SCADA measurement or state estimation, calculating, by the at least one processor, the variance of $X_i(t)$ at each time of PMU sampling relative to $X_i(T_k)$ by the following formula:

$$\Delta X_i(t) = \sum_{j \in S_{pmu-i}} b_{ij}(T_k) \Delta X_j(t), \text{ with } T_k < t < T_{k+1}$$

where $X_j(t)$ is the measurement value from the node j with PMU at PMU sampling time t, and subsequently obtaining the estimated value of quantity $X_i$ of the node i without PMU at time t by the following formula:

$$X_i(t) = \Delta X_i(t) + X_i(T_k),$$

with $T_k < t < T_{k+1}$; and

Step 6: when a new SCADA measurement data or state estimation data for time $T_{k+1}$ arises, processing returns back to the step 4 and the linear combination coefficient is updated.

2. The method of claim 1, wherein the node set $S_{pmu-i}$ in step 2 comprises 4 to 6 nodes.

3. The method of claim 1, wherein, in the step 2, the online automatic search comprises:
calculating the minimum number of line segments between each node with PMU and the node i being automatically according to topological information;
adding the nodes with PMU that are connected to the node i by a segment of line into the set $S_{pmu-i}$; and
adding the nodes with PMU that are connected by two, three, and four segments of line respectively into the set $S_{pmu-i}$, until the number of nodes in the set $S_{pmu-i}$ reaches the predefined size.

4. The method of claim 1, wherein in the step 2, if the physical quantity is selected as either voltage magnitude or current magnitude, when the node with PMU and the node without PMU are at different voltage levels, the voltage or current magnitude of the node with PMU is converted to be at the voltage level of the node without PMU by using rated voltage transformation ratio of two voltage levels.

5. The method of claim 1, wherein in the step 2, if the physical quantity is selected as either voltage phase angle or current phase angle, an absolute phase angle measured by PMU directly is converted into a relative phase angle referring to voltage phasor of a certain node in the electric island, making dynamic process estimation based on relative phase angle, and the relative phase angle is converted into the range from $-180°$ to $+180°$.

6. The method of claim 1, wherein in the step 2, if the physical quantity is selected as either voltage phase angle or current phase angle, when the node with PMU and the node without PMU are at different voltage levels, the voltage or current phase angle of the node with PMU is converted to be at the voltage level of the node without PMU in accordance with phase shift incurred by the connection type of transformer and is converted into the range from $-180°$ to $+180°$.

7. The method of claim 1, wherein in the step 3, the initializing further comprises:
(a) establishing recursive least square mathematic model for solving linear combination coefficients $b_{ij}$, wherein a generic mathematical formula for problems to be solved by recursive least square method is written as follows:

$$d = Aw + v$$

$$\underbrace{\begin{bmatrix} d(0) \\ d(1) \\ \vdots \\ d(N) \end{bmatrix}}_{d} = \underbrace{\begin{bmatrix} u_0^T \\ u_1^T \\ \vdots \\ u_N^T \end{bmatrix}}_{A} w + \underbrace{\begin{bmatrix} v(0) \\ v(1) \\ \vdots \\ v(N) \end{bmatrix}}_{v}$$

where d is a output vector that can be observed, w is a parameter vector that is to be solved, A is a state matrix that is comprised of several vectors $u_j$, $u_j$ representing relationship between parameter vector w and measurement d(j), and v is a noise vector; and for the problem to solve the linear composition coefficient $b_{ij}$ of the variance of the measurement $\Delta X_i$, the variables in the above formula are defined as follows:

$d = [\Delta X_i]$, $w = [b_{i1} b_{i2} \ldots b_{ij} \ldots b_{iN_i}]^T$, $A = u^T = [\Delta X_1 \Delta X_2 \ldots \Delta X_j \ldots \Delta X_{N_i}]$ where $\Delta X_i$ is the difference between the current value and the last value of $X_i$ obtained from SCADA measurement or state estimation; output vector d has only one element in fact because the dynamic processes of difference measurements are estimated one by one, $\Delta X_1$ $\Delta X_2$ ... $\Delta X_j$ ... $\Delta X_{N_i}$ are respectively the differences between the current values and the last values of nodes in $S_{pmu-i}$ obtained from SCADA measurement or state estimation, and $b_{i1}$ $b_{i2}$ ... $b_{ij}$ ... $b_{iN_i}$ are the corresponding linear combination coefficients between $\Delta X_1$ $\Delta X_2$ ... $\Delta X_j$ ... $\Delta X_{N_i}$ and $\Delta X_i$;

(b) The initial value of $b_{ij}$ is usually taken as $1/N_i$, where $N_i$ is the total number of elements in the set $S_{pmu-i}$, and hence the initial value of w is $w_{-1} = [1/N_i \; 1/N_i \ldots 1/N_i]^T$, where the index $-1$ denotes that the corresponding value is an initial value;

(c) assigning weighting factors to the variances of the measurement of nodes with PMU, wherein with the weighting factors being the diagonal elements, weighting matrix $\Pi$ can be obtained, which is a diagonal matrix with $N_i \times N_i$ dimensions, the higher the data quality of the variances of the measurement of nodes with PMU is, the nearer the electric distance between the node and the node to be estimated is, so the greater the corresponding weighting factor is and in the process of solving recursive least square problem, a variable matrix P will be used, and its initial value $P_{-1}$ is taken as $\Pi$, where the index $-1$ denotes that the corresponding value is an initial value and when no clear idea or enough information for data quality of these nodes, preferably all weighting factors are same and are taken as 0.1, and P is $$P_{-1} = \begin{pmatrix} 0.1 & & 0 \\ & \ddots & \\ 0 & & 0.1 \end{pmatrix}; \text{ and}$$

(d) initializing forgetting factor $\lambda$, preferably being 0.99.

8. The method of claim 1, wherein the step 4 further comprises:

(a) calculating the variance $\Delta X_i(T_k)$ of $X_i$ of the node i between time steps k and k−1, and get the output vector $d_k$ at time step k, and the formula is as the following $d_k = [\Delta X_i(T_k)] = [X_i(T_k) - X_i(T_{k-1})];$ (b) calculate the variances of those measurements of the nodes in $S_{pmu-i}$ between time step k and k−1, and a variable vector $u_k$ is obtained according to the following formula:

$u_k^T = [\Delta X_1(T_k) \Delta X_2(T_k) \ldots \Delta X_{N_i}(T_k)] = [X_1(T_k) - X_1(T_{k-1}) X_2(T_k) - X_2(T_{k-1}) \ldots X_{N_i}(T_k) - X_{N_i}(T_{k-1})]$ (c) according to the following three recursive formula, to calculate an intermediate process matrix $g_k$, parameter vector matrix $w_k = [b_{i1}(T_k) \ b_{i2}(T_k) \ \ldots \ b_{iN_i}(T_k)]^T$, and intermediate process matrix $P_k$ for time step k of the recursive least square method, wherein loop variable k begins from time step 0, wherein the $P_{-1}$ and $w_{-1}$ used in the calculation at time step 0 are initialized and given in Step 3, and from the $w_k$ obtained at time step k, the linear combination coefficients $b_{ij}(T_k)$ at time step k can be obtained by:

$$g_k = \frac{\lambda^{-1} P_{k-1} u_k}{1 + \lambda^{-1} u_k^T P_{k-1} u_k}$$

$w_k = w_{k-1} + g_k [d_k - u_k^T w_{k-1}]$ $P_k = \lambda^{-1} [P_{k-1} - g_k u_k^T P_{k-1}].$ 9. The method of claim 1, wherein in the step 5, during the period between two SCADA samplings or two state estimation calculations, if breaker status changes are reported from SCADA, when a line connected directly to the node i without PMU or the nodes j ($j \in S_{pmu-i}$) with PMU is in short or open circuit, one of the following three actions is done:

(a) If a node j with PMU is separated from the system, then its linear combination coefficient is set to zero, and its original value is divided averagely and added to the combination coefficients of the other nodes with PMU;

(b) if a node i without PMU is separated from the system, then $X_i$ is set to zero, and that means the dynamic process of this node cannot be estimated during the period that the node i is separated from the system; If the node i is reconnected to the system, then the dynamic process is estimated by employing the linear combination coefficient before separated as initial $b_{ij}$; and (c) In other cases, system faults don't cause node i without PMU or any node j ($j \in S_{pmu-i}$) with PMU is separated from the system, and hence no special action is done, and the linear combination coefficients are revised by the renewal of SCADA measurement or state estimation data at time step k+1 to reflect the change of grid structure.

10. The method of claim 1, wherein in the step 5, an estimated relative phase angle should be converted into the rang from −180° to +180°; or the estimated relative phase angle is first transformed into an absolute phase angle, then is converted into the range from −180° to +180°.

* * * * *